United States Patent
Gallert et al.

(10) Patent No.: US 11,802,913 B2
(45) Date of Patent: Oct. 31, 2023

(54) ADAPTIVE RESOLVER ENVELOPE DIAGNOSTIC

(71) Applicant: GM Global Technology Operations LLC, Detroit, MI (US)

(72) Inventors: Brian J. Gallert, Waterford, MI (US); Wei Wang, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 54 days.

(21) Appl. No.: 17/497,297

(22) Filed: Oct. 8, 2021

(65) Prior Publication Data

US 2023/0111465 A1    Apr. 13, 2023

(51) Int. Cl.
*G01R 31/34*      (2020.01)
*G01R 25/00*      (2006.01)

(52) U.S. Cl.
CPC .......... *G01R 31/343* (2013.01); *G01R 25/00* (2013.01)

(58) Field of Classification Search
CPC .............................. G01R 31/343; G01R 25/00
See application file for complete search history.

(56) References Cited

U.S. PATENT DOCUMENTS

| | | | | |
|---|---|---|---|---|
| 2,952,500 | A * | 9/1960 | Trechsel | H02K 11/00 310/68 |
| 6,525,502 | B1 * | 2/2003 | Piedl | H03M 1/485 318/605 |
| 2003/0184170 | A1 * | 10/2003 | Kurnia | |
| 2016/0006323 | A1 * | 1/2016 | Hourne | H02K 11/0031 |
| 2016/0161304 | A1 * | 6/2016 | Son | G01D 3/08 324/207.12 |
| 2017/0131379 | A1 * | 5/2017 | Omata | G01R 35/00 |

* cited by examiner

*Primary Examiner* — Catherine T. Rastovski
*Assistant Examiner* — Lal C Mang
(74) *Attorney, Agent, or Firm* — CANTOR COLBURN LLP

(57) ABSTRACT

A diagnostic system for a resolve of a motor and a method of diagnosing the resolver. The diagnostic system includes an x-phase winding, a y-phase winding, and a processor. The x-phase winding generates an x-phase voltage and the y-phase winding generates a y-phase voltage. The processor obtains the x-phase voltage and the y-phase voltage, determines an adaptive cosine envelope from the x-phase voltage and an adaptive sine envelope from the y-phase voltage, determines an adaptive magnitude from the adaptive sine envelope and the adaptive cosine envelope, determines a magnitude average based on the adaptive magnitude, determines a fault of the resolver when a ratio of the adaptive magnitude and the magnitude average is greater than a threshold, and transmits a signal based on the fault.

20 Claims, 4 Drawing Sheets

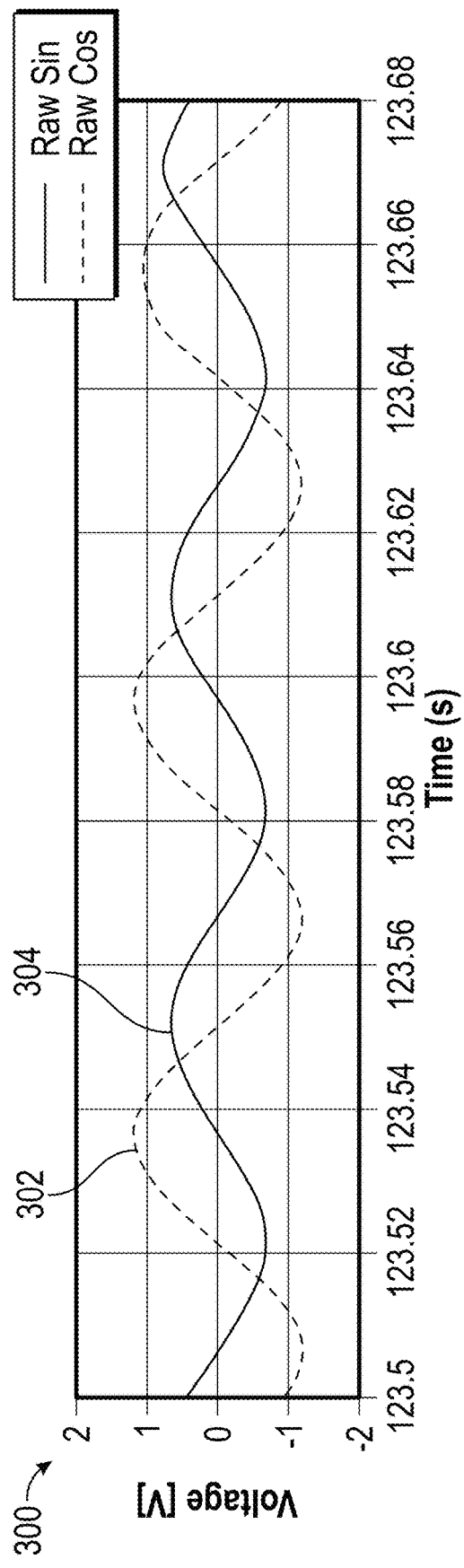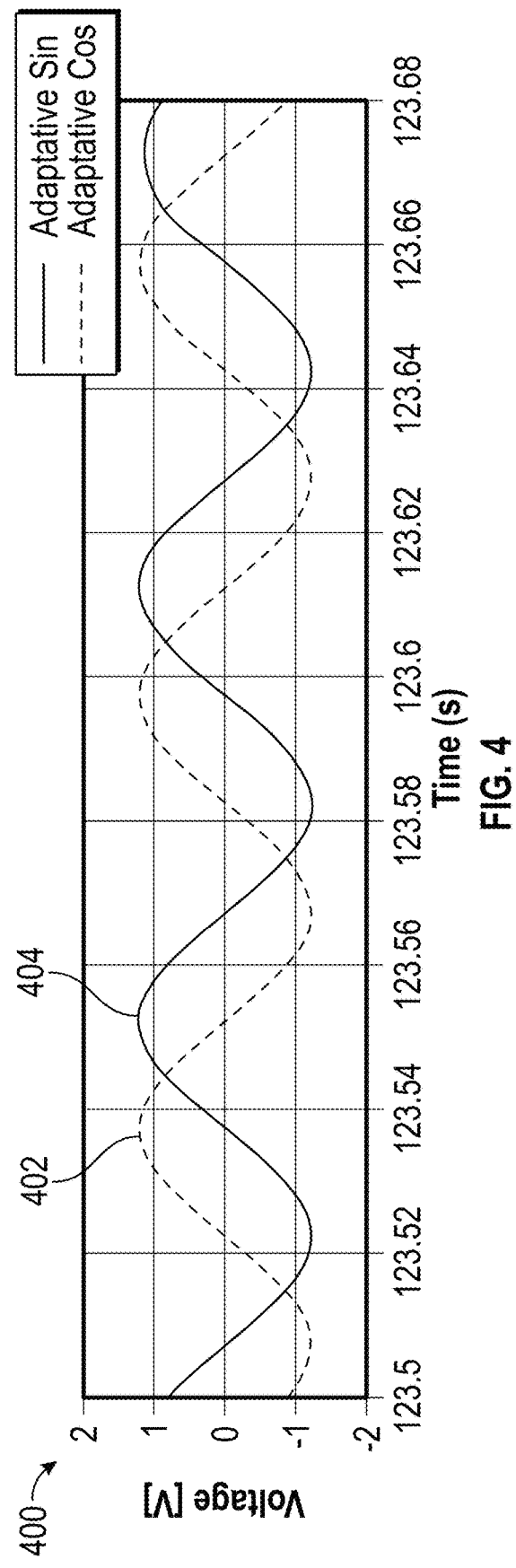
FIG. 3
FIG. 4

ADAPTIVE RESOLVER ENVELOPE DIAGNOSTIC

INTRODUCTION

The subject disclosure relates to electrical motors and, in particular, to a system and method for diagnosing a fault in a resolver used for direct field-oriented control of the electrical motor.

An electric motor can be used to generate rotary motion, which can be used in a propulsion system of an electric vehicle or hybrid vehicle. The electric motor includes a stator and a rotor which rotates within the stator due to magnetic fields generated by electricity running through windings in the stator and/or rotor. The operation of the electric motor can be affected by various parameters, such as angular alignment between the stator and rotor, the angular locations of windings on either or both of the stator and rotor, etc. A resolver can be used to monitor these parameters of the motor in order to correctly control the motor magnetic field. However, the resolver can degrade or become damaged over time, leading to faulty resolver operation which results in incorrect motor magnetic field control. Accordingly, it is desirable to be able to diagnose the operation of the resolver so as to be able to correctly monitor the resolver for replacement when necessary.

SUMMARY

In one exemplary embodiment, a method of diagnosing a resolver of a motor is disclosed. An adaptive sine envelope and an adaptive cosine envelope are obtained from measurements obtained from the resolver. An adaptive magnitude is determined from the adaptive sine envelope and the adaptive cosine envelope. A magnitude average is determined based on the adaptive magnitude. A fault of the resolver is determined based on the adaptive magnitude and the magnitude average.

In addition to one or more of the features described herein, the magnitude average is a rolling average. A plurality of temporally spaced adaptive magnitudes is determined and the rolling average is determined from the plurality of temporally spaced adaptive magnitudes. The method further includes replacing the resolver when the fault is determined. The method further includes determining the fault when an absolute value of a difference between 1 and a ratio of the adaptive magnitude to the magnitude average is greater than a threshold. The method further includes obtaining an x-phase voltage and a y-phase voltage from the resolver and performing wobble compensation on the x-phase voltage and the y-phase voltage to obtain the adaptive cosine envelope and the adaptive sine envelope, respectively. The method further includes determining the fault of the resolver on the motor while the motor is operatively coupled to a vehicle.

In another exemplary embodiment, a diagnostic system for a resolver of a motor is disclosed. The diagnostic system includes an x-phase winding, a y-phase winding, and a processor. The processor is configured to obtain an x-phase voltage from the x-phase winding and a y-phase voltage from the y-phase winding, determine an adaptive cosine envelope from the x-phase voltage and an adaptive sine envelope from the y-phase voltage, determine an adaptive magnitude from the adaptive sine envelope and the adaptive cosine envelope, determine a magnitude average based on the adaptive magnitude, determine a fault of the resolver based on the adaptive magnitude and the magnitude average, and transmit a signal based on the fault.

In addition to one or more of the features described herein, the magnitude average is a rolling average. The processor is further configured to determine a plurality of temporally spaced adaptive magnitudes and determine the rolling average from the plurality of temporally spaced adaptive magnitudes. The signal indicates that the resolver is defective. The processor is further configured to determine the fault when an absolute value of a difference between 1 and a ratio of the adaptive magnitude to the magnitude average is greater than a threshold. The processor is further configured to perform wobble compensation on the x-phase voltage and the y-phase voltage to obtain the adaptive cosine envelope and the adaptive sine envelope, respectively. The processor is further configured to determine the fault of the resolver while the motor is operatively coupled to a vehicle.

In yet another exemplary embodiment, a diagnostic system for use with a resolver of a motor is disclosed. The diagnostic system includes a processor configured to obtain an x-phase voltage from an x-phase winding of the resolver and a y-phase voltage from a y-phase winding of the resolver, determine an adaptive cosine envelope from the x-phase voltage and an adaptive sine envelope from the y-phase voltage, determine an adaptive magnitude from the adaptive sine envelope and the adaptive cosine envelope, determine a magnitude average based on the adaptive magnitude, determine a fault of the resolver when a based on the adaptive magnitude and the magnitude average, and transmit a signal based on the fault.

In addition to one or more of the features described herein, the magnitude average is a rolling average. The processor is further configured to determine a plurality of temporally spaced adaptive magnitudes and determine the rolling average from the plurality of temporally spaced adaptive magnitudes. In an embodiment, the signal indicates that the resolver is defective. The processor is further configured to determine the fault when an absolute value of a difference between 1 and a ratio of the adaptive magnitude to the magnitude average is greater than a threshold. The processor is further configured to perform wobble compensation on the x-phase voltage and the y-phase voltage to obtain the adaptive cosine envelope and the adaptive sine envelope, respectively.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which:

FIG. 3 shows a graph of raw winding voltages received at a processor of the diagnostic system;

FIG. 4 shows a graph of adaptive voltage envelopes;

DETAILED DESCRIPTION

Figure 2:
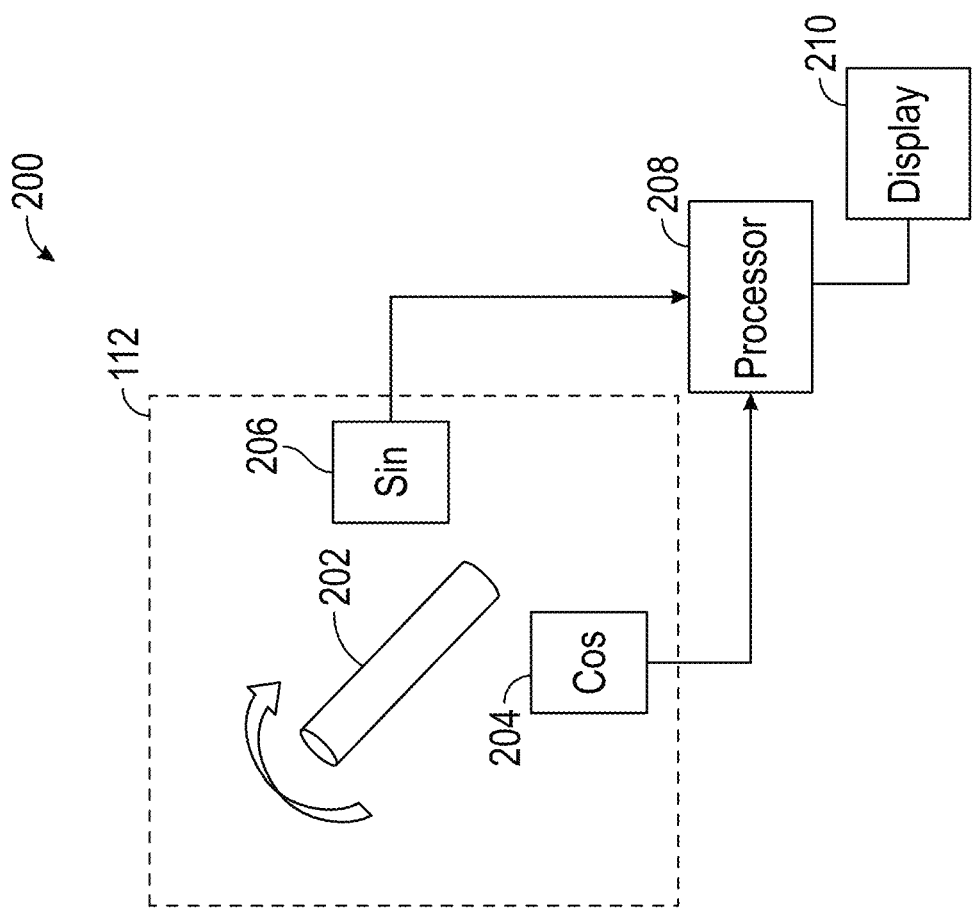
FIG. 2 shows a schematic diagram of a diagnostic system.

The following description is merely exemplary in nature and is not intended to limit the present disclosure, its application or uses. It should be understood that throughout the drawings, corresponding reference numerals indicate like or corresponding parts and features.

Figure 1:
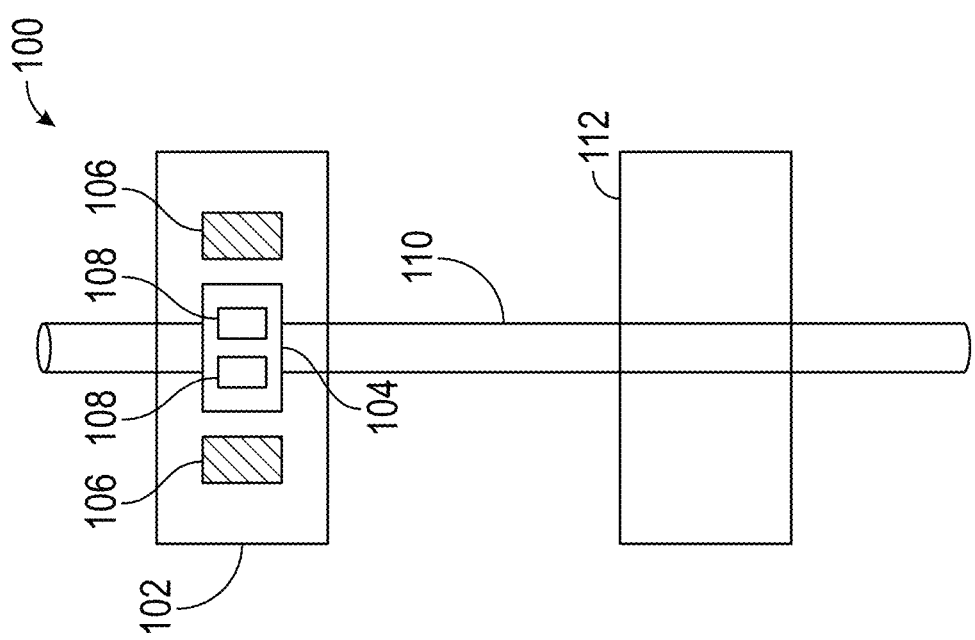
FIG. 1 shows an electric motor in an illustrative embodiment.

In accordance with an exemplary embodiment, FIG. 1 shows an electric motor 100 in an illustrative embodiment. The electric motor 100 can be suitable for use in a vehicle, in various embodiments. In various embodiments, the motor 100 can be coupled to the vehicle for operation of the vehicle during testing and diagnosis. The electric motor 100 includes a stator 102 and a rotor 104 that rotates with the stator 102. The stator 102 includes windings 106 and the rotor 104 includes magnets 108. An electric current is circulated through the windings 106 to generate a magnetic field that interacts with the magnetic fields of the magnets 108, thereby causing the rotor 104 to rotate. The rotor 104 is coupled to a shaft 110 for transmitting the rotation to a device of the vehicle for operation of the vehicle. The shaft 110 passes through a resolver 112, which measures a rotation of the shaft 110.

FIG. 2 shows a schematic diagram of a diagnostic system 200. The diagnostic system 200 is coupled to the resolver 112. The resolver 112 includes a reference winding 202, an x-phase winding 204 and a y-phase winding 206. The reference winding 202 is disposed on the shaft 110. As the shaft 110 rotates, the reference winding 202 rotates relative to the x-phase winding 204 and the y-phase winding 206 of the resolver 112. As viewed in FIG. 2, the shaft 110 is extending perpendicularly out of the page and the reference winding 202 rotates within the plane of the page. The x-phase winding 204 and the y-phase winding 206 are located in a plane transverse to the shaft 110 (i.e., within the page) and are separated from each other by a 90-degree rotation. During rotation, the reference winding 202 excites an x-phase voltage (also referred to herein as a cosine voltage) at the x-phase winding 204 and a y-phase voltage (also referred to herein as a sine voltage) at the y-phase winding 206. The cosine voltage and sine voltage are sent to a processor 208. The processor 208 applies the methods disclosed herein to the cosine voltage and sine voltage to determine a fault in the resolver 112. The processor 208 can then send or transmit a signal to a warning device 210 such as a display or an audio alarm system to indicate that the resolver 112 is either acceptable or fails a diagnostic test. The signal can alert an operator that the resolver is defective, allowing the operator to replace the resolver.

FIG. 3 shows a graph 300 of raw winding voltages received at the processor 208 from the x-phase winding 204 and the y-phase winding 206 due to rotation of the reference winding 202. Time is shown along the abscissa in seconds (s) and amplitude is shown in volts (V) along the ordinate axis. A cosine voltage envelope 302 and a sine voltage envelope 304 are shown over a few rotations of the reference winding 202. The cosine voltage envelope 302 and the sine voltage envelope 304 have a phase relation of about 90 degrees due to the spatial relation of the x-phase winding 204 and y-phase winding 206. The cosine voltage envelope 302 has a different amplitude that the sine voltage envelope 304. This difference can be due to wobble of the reference winding 202 and/or the shaft 110.

FIG. 4 shows a graph 400 of adaptive voltage envelopes. Time is shown along the abscissa in seconds (s) and amplitude is shown in volts (V) along the ordinate axis. The adapted voltages are obtained by compensating the raw voltages for wobble. Wobble compensation normalizes the voltages. Thus, the adaptive cosine voltage 402 and the adaptive sine voltage 404 have the same amplitude. However, the wobble compensate may retain a phase error in a phase offset between the adaptive cosine voltage 402 and the adaptive sine voltage 404. In various embodiments, the phase error can be +−10 degrees.

Figure 5:
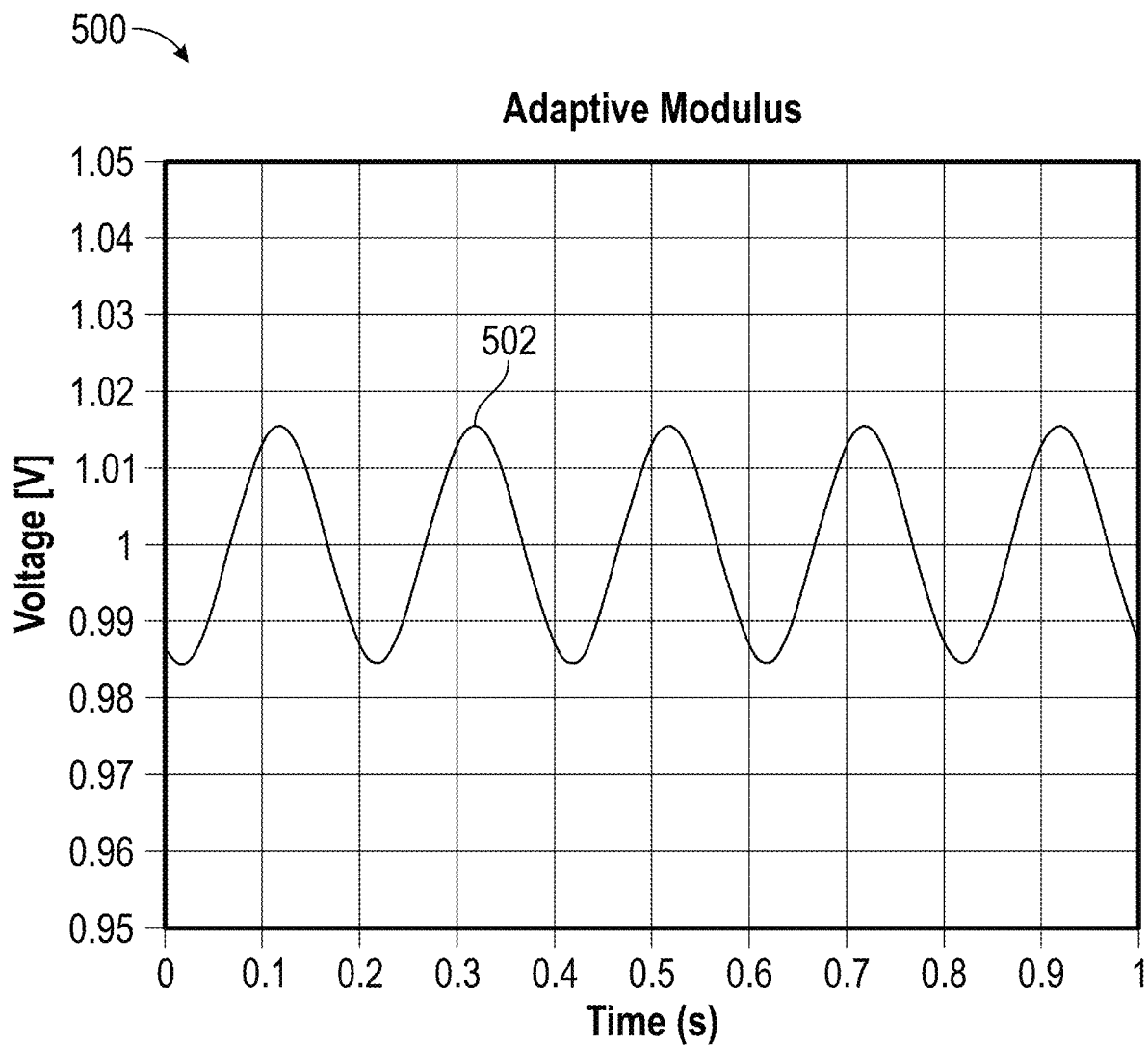
FIG. 5 shows an illustrative graph of an adaptive magnitude based on the adaptive voltage envelopes.

FIG. 5 shows an illustrative graph 500 of an adaptive magnitude 502 based on the adaptive cosine voltage and the adaptive sine voltage. Time is shown along the abscissa in seconds (s) and amplitude is shown in volts (V) along the ordinate axis. The adaptive magnitude 502 (Mag) at a given time can be determined from the value of the adaptive sine envelope and the value of the adaptive cosine envelope, as shown in Eq. (1):

$$\text{Mag} = \sqrt{V_{sin\_adapt}^2 + V_{cos\_adapt}^2} \quad (1)$$

where $V_{sin\_adapt}^2$ is the adaptive sine voltage and $V_{sin\_adapt}^2$ is the adaptive cosine voltage. Ideally, when the x-phase winding 204 and y-phase winding 206 are 90 degrees out of phase, the magnitude is constant over time. However, for operating resolvers, the measured values of the cosine voltage envelope 302 and the sine voltage envelope 304 will have differences and thus the magnitude will vary over time. As illustrated in FIG. 5, the adaptive magnitude 502 (Mag) fluctuates about a standard value, within a region between a lower limit and an upper limit. In various embodiments, the low limit is about 0.985 of the standard value and the upper limit is about 1.015 of the standard value. However, these limit values are not meant as a limitation on the invention. When the fluctuation is sufficiently small, then the resolver 112 can be considered to be non-defective. However, when this fluctuation is large, the resolver 112 is considered defective and operations can be performed to replace the resolver and/or motor. The adaptive magnitude 502 can be compared to an average value (or standard part rated value) to determine whether the resolver is defective.

The adaptive magnitude of Eq. (1) can be obtained at a plurality of times forming a temporal sequence. The plurality of adaptive magnitudes can then be used to generate a magnitude average (Mag_Avg) or time average of the magnitude measurements, as shown in Eq. (2):

$$\text{Mag\_Avg} = \frac{1}{n} \sum_{k=1}^{n} Mag_i \quad (2)$$

where n is the number of values being considers. In various embodiments, the Mag_Avg is a rolling average. Therefore, the Mag_Avg is determined using the n previous Mag values. The Mag and Mag_Avg are used to form a ratio. The ratio is compared to a threshold value, as shown in Eq. (3):

$$\left| 1 - \frac{Mag}{Mag\_Avg} \right| > \text{Threshold} \quad (3)$$

When the absolute value of the difference between the ratio and the value "1" is greater than the threshold, then the resolver is considered defective and an appropriate signal can be sent to the warning device 210. The threshold value can be a predetermined value or a value selected by an operator skilled in the art.

Figure 6:
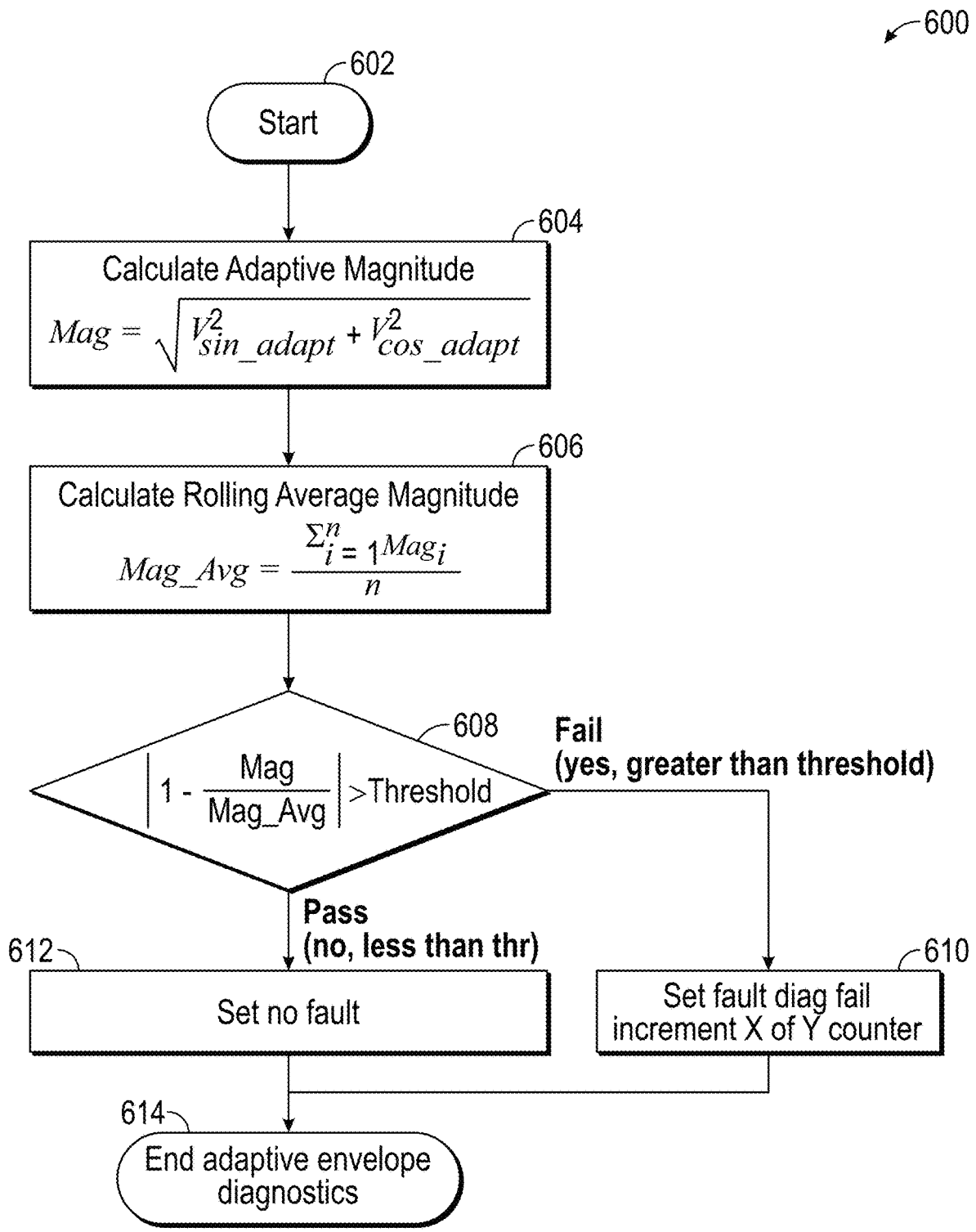
FIG. 6 shows a flowchart of a method for diagnosing a defective resolver.

FIG. 6 shows a flowchart 600 of a method for diagnosing a defective resolver. The method starts at box 602. The cosine voltage and sine voltages are measured and adaptive cosine envelope and adaptive sine enveloped is obtained from the cosine voltage and sine voltage, respectively. In box 604, an adaptive magnitude (Mag) is obtained using, for example, Eq. (1). In box 606, a time average of the adaptive magnitude (Mag_Avg) is determined as shown in Eq. (2). In box 608, a ratio is made between the adaptive magnitude and the time average. The absolute value of the difference between the ratio and the value "1" is compared to a threshold value. If the absolute value of the difference between the ratio and the value "1" is greater than the threshold, then the method proceeds to box 610. In box 610, a fault is set to indicate that the resolver is defective. Referring back to box 608, if the absolute value of the difference is not greater than the threshold, then the method proceeds to box 612. In box 612, no fault is set. From either box 610 or box 612, the method proceeds to box 614, in which the diagnostics is ended.

In a real-world environment, the resolver can experience a large swing in temperature (from −40° C. to 150° C.). The resistance of the x-phase winding 204 and the y-phase winding 206 changes with temperature. As a result, the magnitudes of the cosine voltage envelope 302 and the sine voltage envelope 304 also varies with temperature. Therefore, under extreme temperature conditions, observing only the magnitude of the cosine voltage envelope 302 and the sine voltage envelope 304 does not determine a defective resolver. However, using Eqs. (2) and (3), in which the magnitude of the resolver signal is normalized in real time to produce a ratio, the ratio can be used to detect a fault at the resolver. This ratio is consistent amongst variation in parts and variation in temperature.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof

What is claimed is:

1. A method of diagnosing a resolver that measures a rotation of a shaft of an electric motor, the method comprising:
   receiving, by a diagnostic system, an x-phase voltage from an x-phase winding and a y-phase voltage from a y-phase winding, wherein the x-phase winding and y-phase winding are located in a plane transverse to the shaft, and wherein the x-phase winding and y-phase winding are separated from each other by a ninety-degree rotation;
   determining, by the diagnostic system, an adaptive sine envelope based on the y-phase voltage and an adaptive cosine envelope based on the x-phase voltage;
   determining, by the diagnostic system, an adaptive magnitude from the adaptive sine envelope and the adaptive cosine envelope;
   determining, by the diagnostic system, a magnitude average based on the adaptive magnitude;
   determining, by the diagnostic system, a fault of the resolver based on the adaptive magnitude and the magnitude average; and
   transmitting, by the diagnostic system to a warning device comprising a display screen or an audio alarm system, a signal to cause the warning device to indicate the fault of the resolver via the display screen or the audio alarm system.

2. The method of claim 1, wherein the magnitude average is a rolling average.

3. The method of claim 2, further comprising determining a plurality of temporally spaced adaptive magnitudes and determine the rolling average from the plurality of temporally spaced adaptive magnitudes.

4. The method of claim 1, wherein the signal is further causes the warning device to indicate the resolver is defective and should be replaced by an operator.

5. The method of claim 1, further comprising determining the fault when an absolute value of a difference between 1 and a ratio of the adaptive magnitude to the magnitude average is greater than a threshold.

6. The method of claim 1, further comprising obtaining an x-phase voltage and a y-phase voltage from the resolver and performing wobble compensation on the x-phase voltage and the y-phase voltage to obtain the adaptive cosine envelope and the adaptive sine envelope, respectively.

7. The method of claim 1, further comprising determining the fault of the resolver on the electric motor while the motor is operatively coupled to a vehicle.

8. A diagnostic system for an electric motor, comprising:
   a resolver to measure a rotation of a shaft of the electric motor, the resolver including:
      a reference winding disposed on the shaft; and
      an x-phase winding and a y-phase winding located in a plane transverse to the shaft, wherein the x-phase winding and y-phase winding are separated from each other by a ninety-degree rotation; and
   a processor coupled to the resolver and a warning device comprising a display screen or an audio alarm system, wherein the processor is to:
   receive an x-phase voltage from the x-phase winding;
   receive a y-phase voltage from the y-phase winding;
   determine an adaptive cosine envelope from the x-phase voltage and an adaptive sine envelope from the y-phase voltage;
   determine an adaptive magnitude from the adaptive sine envelope and the adaptive cosine envelope;
   determine a magnitude average based on the adaptive magnitude;
   determine a fault of the resolver based on the adaptive magnitude and the magnitude average; and
   transmit a signal based on the fault to the warning device to cause the warning device to indicate the fault of the resolver via the display screen or audio alarm system.

9. The diagnostic system of claim 8, wherein the magnitude average is a rolling average.

10. The diagnostic system of claim 9, wherein the processor is further configured to determine a plurality of temporally spaced adaptive magnitudes and determine the rolling average from the plurality of temporally spaced adaptive magnitudes.

11. The diagnostic system of claim 8, wherein the signal indicates that the resolver is defective.

12. The diagnostic system of claim 8, wherein the processor is further configured to determine the fault when an absolute value of a difference between 1 and a ratio of the adaptive magnitude to the magnitude average is greater than a threshold.

13. The diagnostic system of claim 8, wherein the processor is further configured to perform wobble compensation on the x-phase voltage and the y-phase voltage to obtain the adaptive cosine envelope and the adaptive sine envelope, respectively.

14. The diagnostic system of claim 8, wherein the processor is further configured to determine the fault of the resolver while the motor is operatively coupled to a vehicle.

15. A diagnostic system for an electric motor that is operatively coupled to a vehicle, the diagnostic system comprising:
- a resolver to measure a rotation of a shaft of the electric motor, the resolver including:
  - a reference winding disposed on the shaft; and
  - an x-phase winding and a y-phase winding located in a plane transverse to the shaft, wherein the x-phase winding and y-phase winding are separated from each other by a ninety-degree rotation; and
- a processor coupled to the resolver and a warning device comprising a display screen or an audio alarm system, wherein the processor is to:
  - receive an x-phase voltage from the x-phase winding;
  - receive a y-phase voltage from the y-phase winding;
  - determine an adaptive cosine envelope from the x-phase voltage and an adaptive sine envelope from the y-phase voltage;
  - determine an adaptive magnitude from the adaptive sine envelope and the adaptive cosine envelope;
  - determine a magnitude average based on the adaptive magnitude;
  - determine a fault of the resolver based on the adaptive magnitude and the magnitude average; and
  - transmit a signal based on the fault to the warning device to cause the warning device to indicate the fault of the resolver via the display screen or audio alarm system.

16. The diagnostic system of claim 15, wherein the magnitude average is a rolling average.

17. The diagnostic system of claim 16, wherein the processor is further configured to determine a plurality of temporally spaced adaptive magnitudes and determine the rolling average from the plurality of temporally spaced adaptive magnitudes.

18. The diagnostic system of claim 15, wherein the signal indicates that the resolver is defective.

19. The diagnostic system of claim 15, wherein the processor is further configured to determine the fault when an absolute value of a difference between 1 and a ratio of the adaptive magnitude to the magnitude average is greater than a threshold.

20. The diagnostic system of claim 15, wherein the processor is further configured to perform wobble compensation on the x-phase voltage and the y-phase voltage to obtain the adaptive cosine envelope and the adaptive sine envelope, respectively.

* * * * *